(12) United States Patent
Hébert et al.

(10) Patent No.: US 7,999,363 B2
(45) Date of Patent: Aug. 16, 2011

(54) STRUCTURE AND METHOD FOR SELF PROTECTION OF POWER DEVICE

(75) Inventors: François Hébert, San Mateo, CA (US); Ming Sun, Sunnyvale, CA (US)

(73) Assignee: Alpha & Omega Semiconductor, Ltd (BM)

( * ) Notice: Subject to any disclaimer, the term of this patent is extended or adjusted under 35 U.S.C. 154(b) by 557 days.

(21) Appl. No.: 11/657,862

(22) Filed: Jan. 25, 2007

(65) Prior Publication Data

US 2008/0180871 A1   Jul. 31, 2008

(51) Int. Cl.
*H01L 23/495* (2006.01)
(52) U.S. Cl. .................. 257/666; 257/E23.116; 438/123
(58) Field of Classification Search .................. 438/123; 257/666, E23.116
See application file for complete search history.

(56) References Cited

U.S. PATENT DOCUMENTS

| 4,752,762 A | | 6/1988 | Inano | |
|---|---|---|---|---|
| 5,313,184 A | * | 5/1994 | Greuter et al. | 338/21 |
| 6,100,745 A | * | 8/2000 | Dougherty | 327/512 |
| 7,180,719 B2 | * | 2/2007 | Whitney | 361/119 |
| 7,408,428 B2 | * | 8/2008 | Larson, III | 333/187 |
| 2005/0200445 A1 | * | 9/2005 | Hwang et al. | 338/22 R |
| 2005/0258805 A1 | * | 11/2005 | Thomas et al. | 320/134 |

* cited by examiner

*Primary Examiner* — Hoai v Pham
*Assistant Examiner* — Elias Ullah
(74) *Attorney, Agent, or Firm* — Bo-In Lin

(57) ABSTRACT

A resetable over-current self-protecting semiconductor power device comprises a vertical power semiconductor chip and an over-current protection layer composed of current limiting material such as a PTC material. The over-current protection layer may be sandwiched between the vertical power semiconductor chip and a conductive plate, which could be a leadframe, a metal plate, a PCB plate or a PCB that the device is mounted on.

27 Claims, 6 Drawing Sheets

STRUCTURE AND METHOD FOR SELF PROTECTION OF POWER DEVICE

BACKGROUND OF THE INVENTION

1. Field of the Invention

The invention relates generally to a device configuration and method of protecting the device. More particularly, this invention relates to an improved circuit configuration and method of protecting power device from damages due to over current caused by an electrical short by using a conductive material with a positive temperature coefficient.

2. Description of the Relevant Art

Under high power conditions, the power devices often fail in a "short circuit" condition and that can result in damages to other components in the system where the power devices are implemented. Therefore, it is preferable that a power device fails in an open circuit state and even more preferable that a failure can be avoided entirely. Prevention of failure can be achieved by integrating a protective circuit as part of the device or outside of the device. One particular protection implemented in a semiconductor device is to place a fusible link such as a metal fuse or a polysilicon fuse shown in FIG. 1A in the interconnect pattern before the bond pads. However, as shown in FIG. 1B such configuration has a limitation that for very high current application, multiple fuses and pads would be required thus causing an increase in die size and that leads to unfavorable cost impacts in manufacturing and in operation. Another disadvantage associates with multiple fuses and pads is that in case not all fuses blow open during an over-current condition, the active region of the device where the fuse did not blow open would be damaged. Furthermore, the addition of the protective circuit such as metal fuse, polyfuse, or other "fail-open" protective circuits, often adversely affects the device or system performance. The fuse protection also has a disadvantage that such protection is not re-settable, once the fuse is broken, the fuse connection is broken even the over current condition is then eliminated.

In order to overcome such limitations, materials of a positive temperature coefficient are implemented as re-settable over current protection device. Various PTC materials are known such as a polymer PTC, which is commercially available in the market as "Polyfuse", "Polyswitch" and "Multiswitch". The products may be provided as a slice of plastic with carbon grains embedded in it. When the plastic is cool, the carbon grains are all in contact with each other, forming a conductive path through the device. When the plastic heats up, it expands, forcing the carbon grains apart, and causing the resistance of the device to rise rapidly. Like the BaTiO3 thermistor, this device has a highly nonlinear resistance/temperature response and is used for switching, not for proportional temperature measurement. The PTC application is disclosed in U.S. Pat. No. 4,238,812 and various data sheets that provide the PTC materials as commercial products. Effectiveness of PTC protections has been demonstrated with an increase in resistance of up to five orders of magnitude when the temperature is increased.

Even though the application of materials of a positive temperature coefficient (PTC) for over-current protection of electronic devices is well known, there are still technical limitations and difficulties when the PTC materials are actually implemented. The PTC Protection circuit is usually achieved by connecting the protection device as in FIG. 1C comprising PTC materials that has a resistance increases with temperature to a load. However, in order to achieve the protection, self-heating is usually required to increase the temperature and that requires an $I^2R$ drop within the device with a special mounting to avoid the heat sink that could reduce the effectiveness of device protection. In the meantime, higher resistance can induce more self-heating to achieve better protection, however, that negatively impacts the performance of the power systems. Alternatively, external heating may be used to heat the PTC materials by adding more circuit components but the added circuit components cause the current limiting protection to occupy large volume.

Therefore, a need still exists in the fields of circuit design and device manufactures for providing a new and improved configuration and manufacturing method to resolve the above-discussed difficulties. Specifically, a need still exists to provide new and improved configuration to implement the PTC protection such that the above discussed limitations and difficulties can be resolved.

SUMMARY OF THE PRESENT INVENTION

It is therefore an aspect of the present invention to provide a new and improved resetable PTC protection configuration such that the temperature rise within the electronic device is automatically imposed onto the PTC material and furthermore, the PTC protection is implemented with minimum increase of the parasitic resistance such that the above-discussed difficulties and limitations encountered by the conventional PTC protection can be overcome.

More specifically, one aspect of the present invention is to provide a new and improved PTC protection configuration that the PTC protection have great thermal coupling with the heat generation components or regions within an electronic device and meanwhile, such coupling is provided with minimum increase in coupling or parasitic resistance.

Another aspect of the present invention to provide a new and improved PTC protection configuration that the PTC protection configuration can be conveniently implemented with standard packaging techniques thus the unfavorable impact on manufacture costs can be avoided.

Another aspect of the present invention to provide a new and improved PTC protection configuration that the PTC protection configuration can be implemented without increase in package size thus decreasing potential unfavorable impact on manufacture costs.

Briefly in a preferred embodiment this invention discloses a vertical semiconductor power device that includes a top surface and a bottom surface of a semiconductor substrate constituting a vertical current path for conducting a current there through. The semiconductor power device further includes an over current protection layer composed of a material constituting as a part of the vertical current path for limiting a current passing there through. In an exemplary embodiment, the over current protection layer composed of a resetable current limiting material. In another exemplary embodiment, the over current protection layer composed of a material of a positive temperature coefficient (PTC) of resistance. In another exemplary embodiment, the over current protection layer is attached to the bottom surface. In another exemplary embodiment, the over current protection layer is attached to the top surface. In another exemplary embodiment, the over current protection layer is disposed between the semiconductor substrate and a conductive plate. In another exemplary embodiment, the over current protection layer is disposed between the semiconductor substrate and a conductive plate functioning a leadframe for the semiconductor power device. In another exemplary embodiment, the over current protection layer is composed of a material with a positive coefficient of temperature (PTC) of resistance as a resetable current limiting layer. In another exemplary embodiment, the over current protection layer is patterned for optimizing a device protection effect. In another exemplary embodiment, the vertical semiconductor power device includes a MOSFET chip having the bottom surface functioning as a drain electrode for contacting the over current protection layer. In another exemplary embodiment, the vertical semiconductor power device includes a bottom-source MOSFET chip having the bottom surface functioning as a source electrode for contacting the over current protection layer.

The present invention further discloses a method for manufacturing an electronic device with an integrated over current protection. The method includes a step of disposing an over current protection layer composed of a current limiting material. The method further includes a step of connecting a semiconductor chip onto a first side of said over current protection layer; connecting a conductive plate onto a second side of said layer of over current protection layer.

These and other objects and advantages of the present invention will no doubt become obvious to those of ordinary skill in the art after having read the following detailed description of the preferred embodiment, which is illustrated in the various drawing figures.

BRIEF DESCRIPTION OF THE DRAWINGS

FIGS. 6A-1 and 6A-2 are a cross sectional view and a bottom view of a CSP package implemented with a PTC protection on the package lid of this invention.

FIGS. 6B-1 and 6B-2 are a cross sectional view and a bottom view of a CSP package implemented with a PTC protection on the customer board side of this invention.

DETAILED DESCRIPTION OF THE METHOD

Figure 1A:
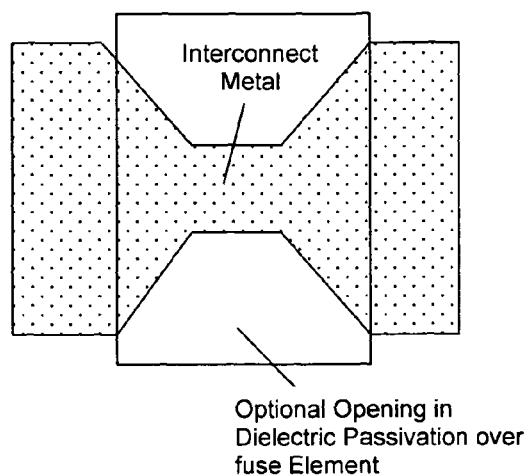
FIGS. 1A to 1C show different implementation configurations of over current protections for protecting devices from damages caused by circuit short.
Figure 1B:
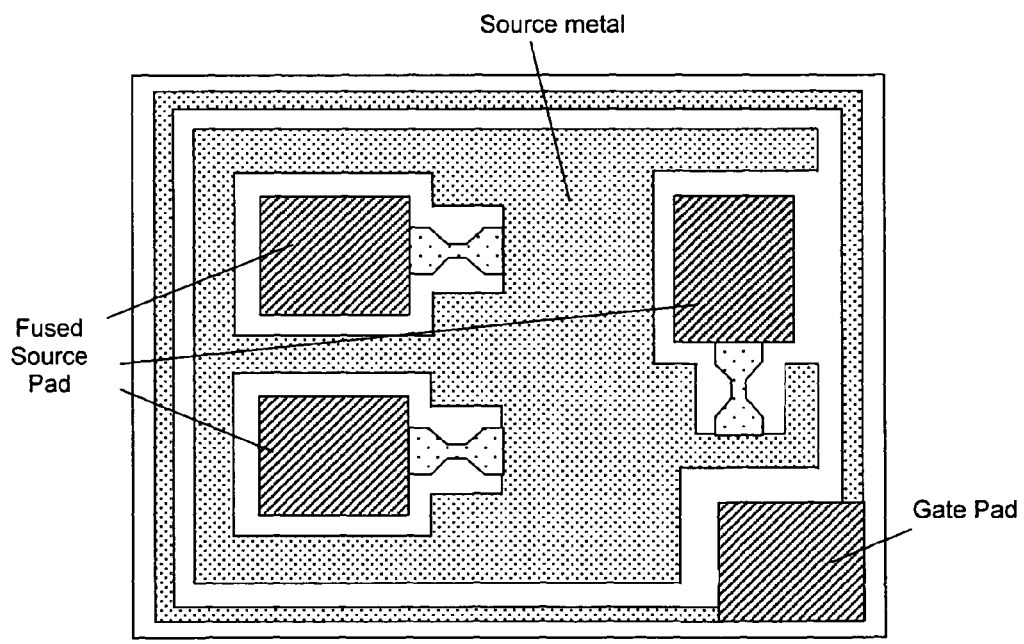
Figure 1C:
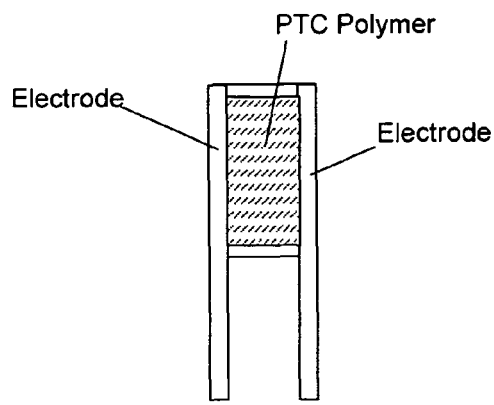
Figure 2:
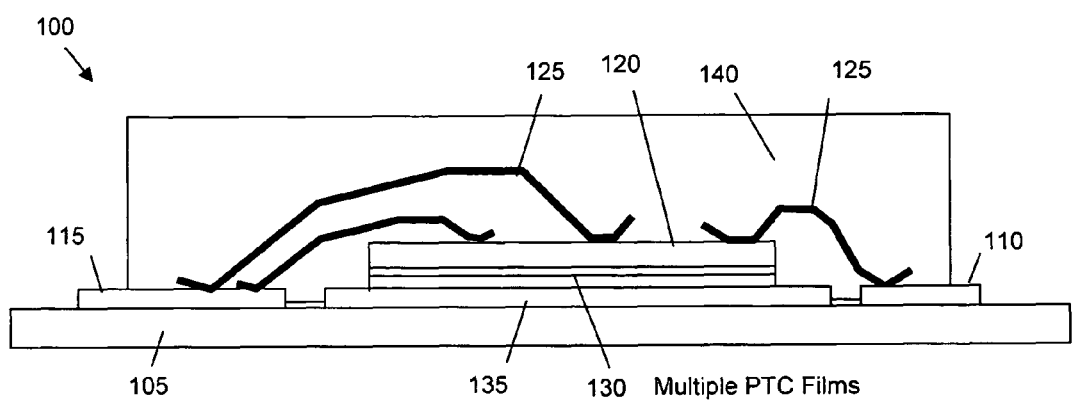
FIG. 2 is a side cross sectional view of a standard vertical DMOS power MOSFET implemented with a PTC protection of this invention.

Referring to FIG. 2 for a side cross-sectional view of a new and improved packaging configuration of a semiconductor power device 100, e.g., a standard vertical DMOS power MOSFET mounted on a printed circuit board (PCB) 105. The PCB 105 supports a leadframe includes a gate terminal 110 on the right for connecting to a gate pad (not specifically shown) on the chip 120 and the leadframe includes a source terminal 115 on the left for connecting to a source metal (not specifically) on the chip 120. The connections between the terminals 110 and 115 to the chip 120 are through the bond wires 125. The chip 120, e.g., the power MOSFET, having a drain on the bottom is disposed on a positive temperature coefficient (PTC) layer 130 for connecting to a die pad 135 in the center functioning as a drain lead. The whole package is then contained and protected in a molding compound 140.

The connections between the MOSFET chip 120, the PTC layer 130 and the die pad may be facilitated by solder paste, conductive epoxy or other conductive materials. In one embodiment, the PTC layer 130 is a PTC film with conductive layers formed on the surfaces of the PTC layer to facilitate the die attachment process. The conductive metal layers on top and under the PTC film can be sputtered, evaporated or plated on the PTC material, and can be Copper, Gold, or other surfaces compatible with die attach solders and epoxies. In another embodiment the PTC layer 130 is applied onto a back surface of a MOSFET wafer comprising a plurality of MOSFET chips 120 before dicing into individual chips. In another embodiment the PTC layer 130 is applied onto the die pad of 135 before die attachment. In another embodiment the PTC layer 130 is a conductive epoxy with a positive temperature of coefficient of resistance, for example, a mixture of a conductive epoxy and a powder of a PTC material.

In operation a vertical current path forms between the source and the drain of the MOSFET chip 120 located on the top and the bottom surface of the chip. The current path further extends vertically through the PTC layer 130 functioning as a variable resistor in series to the MOSFET chip 120. The heat generated by the MOSFET chip 120 controls the variation of resistance of the PTC layer 130. In normal operation a certain amount of heat generated by MOSFET chip 120 is dissipated to the ambient through the molding compound 140 and the leadframe. The device operates at a thermal balance condition and maintains at a normal operation temperature under which the impedance of PTC layer 130 is designed to maintain low. When over current occurs, MOSFET chip 120 generates extra heat that causes the temperature of PTC layer to increase leading to the increase of resistance to an extent that the current is reduced. After the over current condition is removed, the temperature will return to normal operation temperature and the resistance of PTC layer 130 will return to low. The protection is therefore resetable. Since the resistance increase with increased power dissipation, or increased current through the device to be protected, rather than through self-heating of the PTC material itself, the PTC material can have a lower resistance below normal operation temperature as the heat generation to increase it's resistance is from the device to be protected, the PTC material does not require a high initial resistance to be effective as in the case of self-heating. Further, the device may remain a compact package without increase of volume or other complexity.

The PTC layer 130 as shown can be implemented with materials that include doped ceramics such as barium titanate. Conductive polymers such as polymers having a particular filler dispersed inside the polymer can be applied. Such PTC materials have been successfully used to fabricate fuses for very thin layer application, i.e., 0.5 microns of layer thickness. The performance of protection can be optimized based on PTC material layout. Applications of the above disclosed configuration by placing PTC materials or layers as part of the electrical and thermal transmission paths may be extended to multiple assembly techniques. As the leadframe based packages shown in FIG. 2, the PTC layer can be mounted between die and leadframe die-pad area. For the chip-on-board (COB) assemblies, the PTC layer can be inserted between die and the PCB material. In a chip-size package (CSP) packages, the PTC layer may be inserted between the die and the package portion of the CSP package. Further, other type of current limiting material such as a phase changing material that changes from a current conducting phase to a current limiting phase when triggered by high current density, can be easily implemented to replace PTC material without any modification of the structure.

Figure 3:
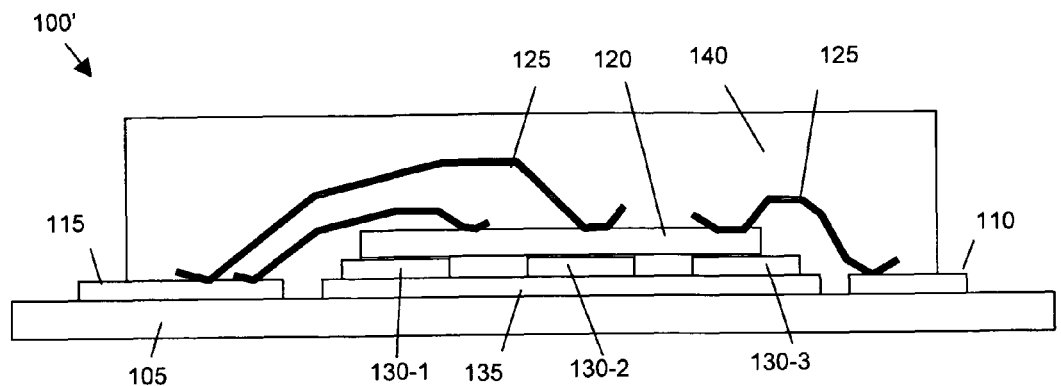
FIG. 3 is a side cross sectional view of a standard vertical DMOS power MOSFET implemented with an alternate PTC protection of this invention with patterned PTC to increase the resistance.

FIG. 3 is a cross sectional view of a package for a semiconductor power device 100' with a PTC pattern for optimizing the device protection with increased resistance thus increasing the thermal coupling and protection. The package 100' is similar to that shown in FIG. 2 except that the PTC layer 130 is now patterned into three segments 130-1, 130-2 and 130-3 thus increasing the resistance for the connection between the drain at the bottom of the MOSFET chip 120 and the leadframe 135. The increased resistance of the PTC layer increases the thermal coupling to rapidly increase the resistance as the temperature of the PTC layer 130 is increased for more effectively limiting the current when an electric short condition occurs thus providing better device protection. The PTC layer 130 may further be patterned into "donut" shape, stripes, grid and etc.

The PTC layer or PTC materials may be implemented with Schottky diodes by placing the PTC as part of electrically conducting path with certain resistance to protect the Schottky diodes that can thermally run-sway in some applications. The applications may include boot converters for display products to prevent fire when pin-to-pin tests are performed. Many power circuits include but not limited to boost buck power circuits, synchronized and non-synchronized buck converters, regulators, LDO, etc., can also benefit from the protection with an implementation of the configuration as disclosed in this invention with a PTC layer or fused layer disposed in an electrical and thermal conductive path. The PTC can also be applied to standard vertical DMOS as well as vertical Schottky diodes, bottom source LDMOS, bottom anode Schottky, IGBT, etc.

Figure 4A:
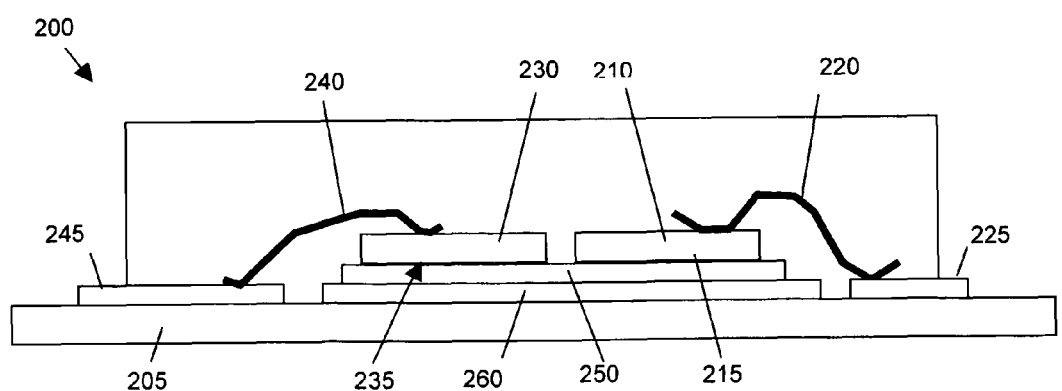
FIG. 4A is a side cross sectional view of a buck converter implemented with a PTC protection of this invention and FIG. 4B is a circuit diagram of FIG. 4A.
Figure 4B:
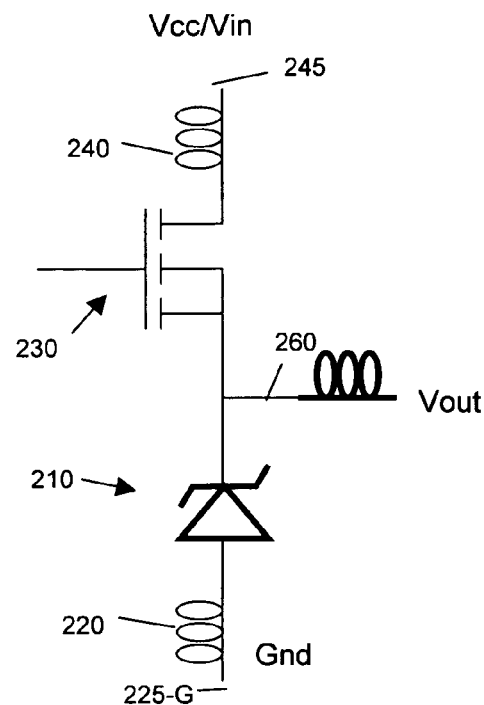

FIGS. 4A and 4B show a cross sectional view and a circuit diagram of a buck converter 200 implemented with PTC protection configuration of this invention. The buck converter 200 is mounted on a PC board 205. The buck converter 200 includes a Schottky diode 210 with a bottom cathode 215 and top anode (not specifically shown) connected through an anode wire 220 to a ground terminal 225 of a leadframe. The buck converter further includes a high-side FET 230 having a bottom source 235 and a top drain (not specifically shown) connected through bond wires 240 to a Vcc/Vin terminal 245 of the leadframe. FET 230 also includes a gate pad electrically connected to a gate lead of leadframe (not shown). Detail description and manufacturing method of FET 230 are disclosed in U.S. patent application Ser. No. 11/495,803 by applicant on Jul. 28, 2006 and is hereby incorporated as reference. The bottom cathode 215 of the Schottky diode 210 and the bottom source 235 of the high-side FET 230 are connected through a PTC layer 250 to an output terminal 260 of the leadframe supported directly on the PC board 205. Since the PTC layer 250 is part of the electrical and thermal conducting path, an increase in the conducting current automatically causes a raise in temperature thus causing an increase in the resistance of the PTC layer 250. The buck converter 200 is therefore protected with the PTC layer 250 that limits the current that can pass through the Schottky diode 210 and the FET 230.

Figure 5A:
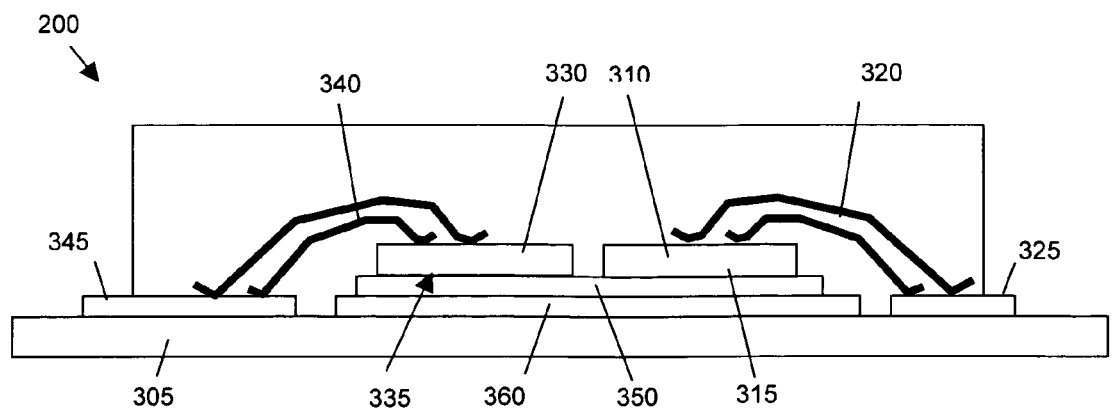
FIG. 5A is a side cross sectional view of a booster converter implemented with a PTC protection of this invention and FIG. 5B is a circuit diagram of FIG. 4A.
Figure 5B:
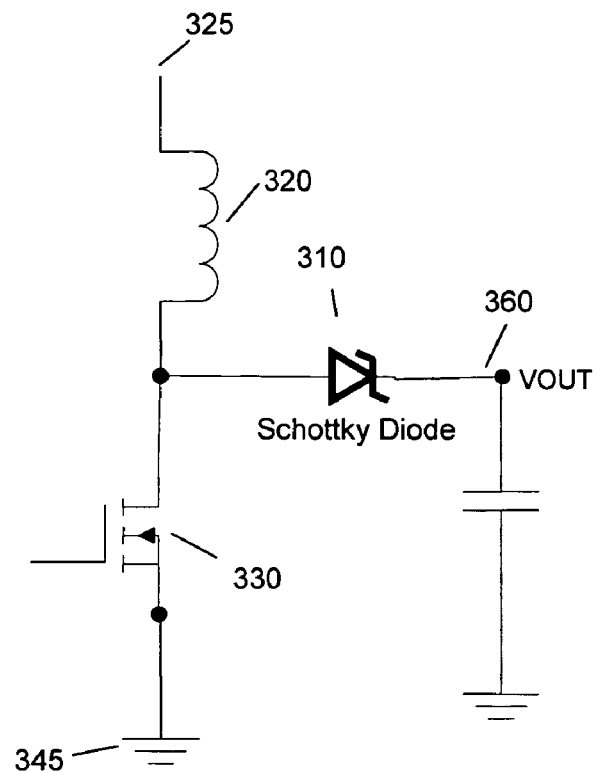

FIGS. 5A and 5B show a cross sectional view and a circuit diagram of a booster converter 300 implemented with PTC protection configuration of this invention. The booster converter 300 is mounted on a PC board 305. The booster converter 300 includes a Schottky diode 310 with a bottom anode 315 and top cathode (not specifically shown) connected through an cathode and source/drain wire 320 to a Vcc terminal 325 of a leadframe. The booster converter further includes a low-side FET 330 having a bottom drain 335 and a top source and gate (not specifically shown) connected through bond wires 340 to a ground terminal 345 of the leadframe. FET 330 also includes a gate pad electrically connected to a gate lead of leadframe (not shown). Detail description and manufacturing method of FET 330 are disclosed in U.S. patent application Ser. No. 11/495,803 by applicant on Jul. 28, 2006 and is hereby incorporated as reference. The bottom anode 315 of the Schottky diode 310 and the bottom drain 335 of the low-side FET 330 are connected through a PTC layer 350 to an output terminal 360 of the leadframe mounted directly on the PC board 305. Since the PTC layer 350 is part of the electrical and thermal conducting path, an increase in the conducting current automatically causes a raise in temperature thus causing an increase in the resistance of the PTC layer 350. The booster converter 300 including the Schottky diode and the low-side FET are therefore protected with the PTC layer 350 that limits the current that can pass through the Schottky diode 310 and the FET 330.

Figures 1, 6A:
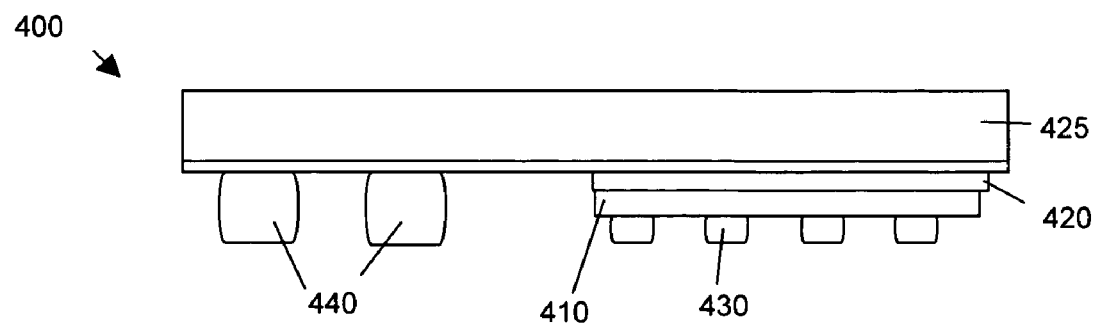
Figures 2, 6A:
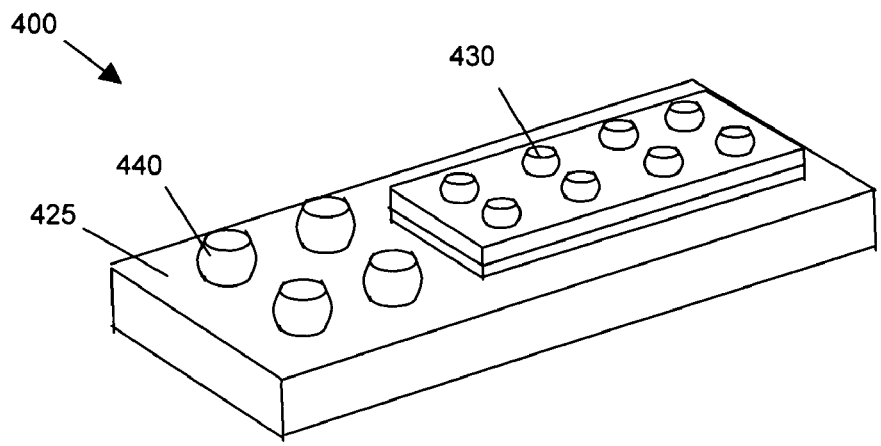
Figures 1, 6B:
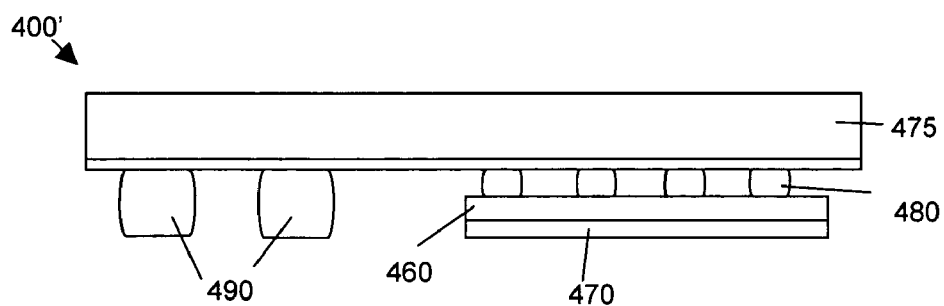
Figures 2, 6B:
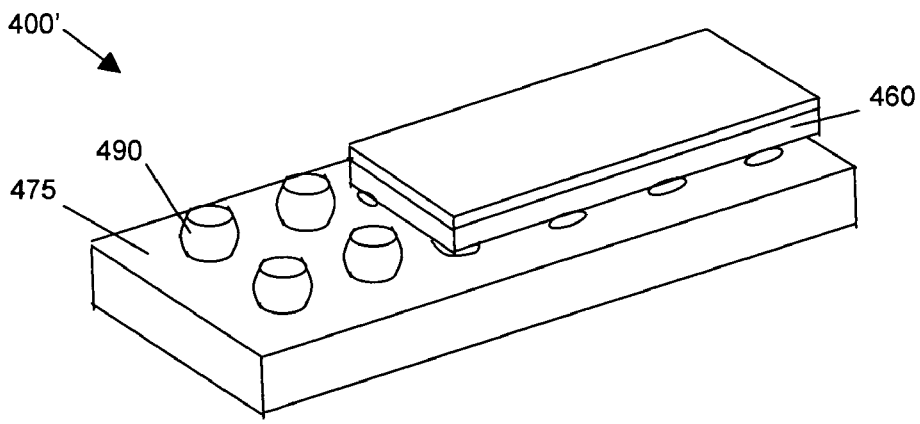

FIGS. 6A-1 and 6A-2 shows a side cross sectional view and a bottom view respectively of a first configuration of a CSP package implemented with a PTC protection of this invention. In the exemplary embodiment, the package contains a CSP-fuse-FET 410 with a drain contacting a PTC protection layer 420 interposed between the drain of the FET 410 and a conductive plate 425, such as a PCB or a metal. The CSP-fuse-FET 410 has solder bumps 430 connected to source and gate of the FET and the package 400 further includes ball grid array 440 supported on the conductive plate 425. As shown in FIGS. 6A-1 and 6A-2, this configuration is a PTC on the package "lid" configuration. FIGS. 6B-1 and 6B-2 shows a side cross sectional view and a bottom view respectively of a second configuration of a CSP package implemented with a PTC protection of this invention. In the exemplary embodiment, the package contains a CSP-fuse-FET 460 with a drain contacting a PTC protection layer 470 that has substantially a same area as and in directly contact with the chip bottom-surface of the CSP-fuse FET 460 functioning as the drain of the FET 460 and a PC board 475. The CSP-fuse-FET 460 has solder bumps 480 connected to source and gate of the FET and the package 450 further includes ball grid array 490 supported on the conductive plate 475. As shown in FIGS. 6B-1 and 6B-2, this configuration is a PTC provided on the customer board side.

The implementation of the PTC protection can be further extended with a configuration where the PTC material is disposed on both sides of the conductive layers. Such configurations facilitate assembly using conductive epoxy or solder attachments. Furthermore, the conductive films, e.g., metal, copper, aluminum, Ti—Ni—Ag, etc., can be sputter deposited, evaporated, or plated. In addition to using the PTC substrate under the die for protection, the PTC material can be added to the die attach materials, such as addition to the epoxy, to simplify the implementation. The silicon wafer can be bonded to a PTC film prior to wafer dicing and the PTC protection layer on each chip has substantially a same area as and in directly contact with the chip top-surface or bottom-surface of each chip after a dicing process is performed to divide the wafer into a plurality of individual chips. Such operation eliminates the requirements for separating assembly of the PTC material under the active device for protection thus significantly simplifies the manufacturing processes.

According to above descriptions and drawings, this invention further discloses a semiconductor power device that includes at least two semiconductor chips having multiple of surfaces for conducting a current between at least two the surfaces as a current conducting path. The semiconductor power device further includes an over current protection layer constituting a part of the current conducting path in at least one of the semiconductor chips wherein the current protection layer composed of a current limiting material. In an exemplary embodiment, the multiple semiconductor chips are interconnected to function as a multiple-chip module (MCM) protected by the over current protection layer. In another exemplary embodiment, the multiple semiconductor chips includes a MOSFET chip and a diode to function as a buck converter protected by the over current protection layer. In another exemplary embodiment, the multiple semiconductor chips includes a MOSFET chip and a diode to function as a booster converter protected by the over current protection layer. In another exemplary embodiment, the over current protection layer composed of a resetable current limiting material. In another exemplary embodiment, the over current protection layer composed of a material of a positive temperature coefficient (PTC) of resistance. In another exemplary embodiment, the over current protection layer disposed between the semiconductor chips and a conductive plate for supporting the semiconductor power device. In another exemplary embodiment, the over current protection layer disposed between the semiconductor substrate and a conductive plate functioning a leadframe for the semiconductor power device. In another exemplary embodiment, the over current protection layer disposed between the semiconductor chips and a conductive plate for supported on a printed circuit board (PCB) to support and connect the semiconductor power device.

Although the present invention has been described in terms of the presently preferred embodiment, it is to be understood that such disclosure is not to be interpreted as limiting. Various alterations and modifications will no doubt become apparent to those skilled in the art after reading the above disclosure. Accordingly, it is intended that the appended claims be interpreted as covering all alterations and modifications as fall within the true spirit and scope of the invention.

We claim:

1. A vertical semiconductor power chip formed in a semiconductor substrate comprising:
    a top chip-surface and a bottom chip-surface constituting a top and a bottom electrodes respectively of said semiconductor power chip wherein at least one of the top or bottom electrodes constitutes a flat top or bottom electrode; and
    an over current protection film having a positive temperature coefficient (PTC) of resistance is directly coated over and having substantially a same area as the top chip-surface or bottom chip-surface constituting said top or bottom electrode.

2. The vertical semiconductor power chip of claim 1 wherein:
    said over current protection film composed of a resetable current limiting material having a nominally low resistance when a temperature of said vertical semiconductor power chip decreases substantially to a normal temperature.

3. The vertical semiconductor power chip of claim 1 wherein:
    said over current protection film composed of the positive temperature coefficient (PTC) of resistance having a thickness ranging from few microns to 0.5 microns.

4. The vertical semiconductor power chip of claim 1 wherein:
    said over current protection film further comprises multiple layers of conductive films with the positive temperature coefficient (PTC) of resistance directly coated onto and having the same area as the bottom chip-surface constituting the flat electrode of the semiconductor substrate.

5. The vertical semiconductor power chip of claim 1 wherein:
    said over current protection film further comprises multiple layers of conductive films with the positive temperature coefficient (PTC) of resistance attaching to and having the same area as said top chip-surface constituting the flat electrode of said semiconductor power chip.

6. The vertical semiconductor power chip of claim 1 wherein:
    said over current protection film further comprises multiple layers of conductive films with the positive temperature coefficient (PTC) of resistance directly coated onto and having the same area as the top chip-surface or bottom chip-surface constituting the top or bottom flat electrode of the semiconductor power chip wherein said over current protection film is covered by a conductive plate attached to the over current protection film coated over the top or bottom chip-surface of said semiconductor power chip for electrically connecting to an external electrical terminal.

7. The vertical semiconductor power chip of claim 1 wherein:
    said over current protection film further comprises multiple layers of conductive films with the positive temperature coefficient (PTC) of resistance directly coated onto and having the same area as the top chip-surface or bottom chip-surface constituting the top or bottom flat electrode of the semiconductor power chip wherein said over current protection film is covered by a conductive plate attached to the over current protection film coated over the top or bottom chip-surface of said semiconductor substrate wherein said conductive plate functioning as a leadframe for electrically connecting to an external electrical terminal.

8. The vertical semiconductor power chip of claim 1 wherein:
    said over current protection film is composed of a conductive epoxy mixed with powders of the material of the positive temperature coefficient (PTC) of resistance.

9. The vertical semiconductor power chip of claim 1 wherein:
    said over current protection film is patterned with openings constituting as a part of the vertical current path for optimizing a device protection effect.

10. The vertical semiconductor power chip of claim 1 wherein:
    said vertical semiconductor power chip comprising a MOSFET chip having said bottom chip-surface constituting the bottom flat electrode formed as a flat drain electrode directly coated with said over current protection film having the same area as the flat drain electrode.

11. The vertical semiconductor power chip of claim 1 wherein:
    said vertical semiconductor power chip comprising a bottom-source MOSFET chip having said bottom chip-surface constituting the bottom flat electrode formed as a flat source electrode directly coated with said over current protection film having the same area as the flat source electrode.

12. A semiconductor power device comprising:
    at least two semiconductor chips formed on two semiconductor substrates each of said semiconductor chips having a top chip-surface and bottom chip-surface wherein at least one of the top chip-surface or bottom chip-surface constitutes a top or bottom flat electrode of said semiconductor power device; and an over current protection film having a positive temperature coefficient (PTC) of resistance directly coated over and having substantially a same area as said top chip-surface or bottom chip-surface functioning as the flat electrode of at least one of said semiconductor chips constituting a part of said current conducting path in at least one of said semiconductor chips.

13. The semiconductor power device of claim 12 wherein:
said at least two semiconductor chips are interconnected to function as a multiple-chip module (MCM) protected by said over current protection film coated over and having substantially the same area as said top chip-surface or bottom chip-surface functioning as the flat electrode of one of said semiconductor chips wherein said over current protection film having a thickness ranging from few microns to 0.5 microns.

14. The semiconductor power device of claim 12 wherein:
said at least two semiconductor chips comprising a MOSFET chip and a diode to function as a buck converter protected by said over current protection film coated directly over and having substantially the same area as said top chip-surface or bottom chip-surface functioning as the flat electrode of the MOSFET chip wherein said over current protection film having a thickness ranging from few microns to 0.5 microns.

15. The semiconductor power device of claim 12 wherein:
said at least two semiconductor chips comprising a MOSFET chip and a diode to function as a booster converter protected by said over current protection film coated directly over and having substantially the same area as said top chip-surface or bottom chip-surface functioning as the flat electrode of the MOSFET chip wherein said over current protection film having a thickness ranging from few microns to 0.5 microns.

16. The semiconductor power device of claim 12 wherein:
said over current protection layer composed of a resetable current limiting material having a nominally low resistance when a temperature of said semiconductor chip decreases substantially to a normal temperature.

17. The semiconductor power device of claim 12 wherein:
said over current protection film composed of the positive temperature coefficient (PTC) of resistance having a thickness ranging from few microns to 0.5 microns.

18. The semiconductor power device of claim 12 wherein:
said over current protection film is composed of a conductive epoxy mixed with powders of the material of the positive temperature coefficient (PTC) of resistance.

19. The semiconductor power device of claim 12 further comprising:
a conductive plate coated with said over current protection film wherein said over current protection film directly contacting one of said top chip-surface or bottom chip-surface functioning as the electrodes of one of said semiconductor power chips and the conductive plate further electrically connecting to an external electrical terminal.

20. The semiconductor power device of claim 12 further comprising:
a conductive plate functioning as a leadframe coated with said over current protection film wherein the over current protection film directly contacting one of said top chip-surface or bottom chip-surface functioning as the electrodes of one of said semiconductor power chips and the leadframe further electrically connecting to an external electrical terminal.

21. The semiconductor power device of claim 12 further comprising:
a conductive plate formed on a printed circuit board (PCB) coated with said over current protection film wherein the over current protection film directly contacting one of said top chip-surface or bottom chip-surface functioning as the electrodes of one of said semiconductor power chips wherein the conductive plate further electrically connecting to an external electrical terminal.

22. A method for making a plurality of semiconductor power chips comprising the steps of:
coating an over current protection film having a positive temperature coefficient (PTC) of resistance directly on a top chip-surface or a bottom chip-surface functioning as an electrode formed as a flat electrode on the bottom chip-surface or top chip-surface of a semiconductor wafer before dicing the wafer into said plurality of semiconductor chips; and dicing the semiconductor wafer into the plurality of semiconductor chips wherein each of said semiconductor chips having the flat electrode disposed on the top chip-surface or bottom chip-surface of said semiconductor chips protected by the over current protection film already coated on and having substantially a same area as each of said plurality of semiconductor chips.

23. The method of claim 22 wherein:
said step of coating said over current protection film further comprising a step of coating the over current protection film having a thickness ranging from few microns to 0.5 microns on the top chip-surface or the bottom chip-surface functioning as the flat electrode.

24. The method of claim 22 further comprising a step of:
said step of coating said over current protection film further comprising a step of coating the over current protection film with powders of the material of the positive temperature coefficient (PTC) of resistance mixing with a conductive epoxy on the top chip-surface or the bottom chip-surface functioning as the flat electrode.

25. The method of claim 22 further comprising a step of:
coating a layer of the over current protection film onto a die pad of a leadframe before carrying out a process of die attachment by attaching one of said semiconductor chips onto the die pad.

26. The method of claim 22 further comprising a step of:
coating a layer of the over current protection film onto a bottom chip-surface of each of the semiconductor chips, wherein said over current protection film is coated with substantially a same area as the bottom chip-surface of each of the semiconductor chips, before carrying out a process of die attachment by attaching the bottom chip-surface of each of the semiconductor chips coated with said over current protection film onto a die pad.

27. The method of claim 22 wherein:
the step of coating the over current protection film directly on the top chip-surface or a bottom chip-surface functioning as the flat electrode before dicing further comprising a step of directly coating the over current protection film onto a bottom chip-surface functioning as the flat electrode on the bottom surface of the semiconductor wafer before dicing the semiconductor wafer into said plurality of semiconductor chips.

* * * * *